(12) United States Patent
Choe

(10) Patent No.: US 6,876,230 B2
(45) Date of Patent: Apr. 5, 2005

(54) SYNCHRONOUS CLOCKED FULL-RAIL DIFFERENTIAL LOGIC WITH SINGLE-RAIL LOGIC AND SHUT-OFF

(75) Inventor: Swee Yew Choe, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 15 days.

(21) Appl. No.: 10/611,266

(22) Filed: Jun. 30, 2003

(65) Prior Publication Data

US 2004/0263207 A1 Dec. 30, 2004

(51) Int. Cl.⁷ .................... H03K 19/096; H03K 19/094
(52) U.S. Cl. ...................... 326/83; 326/95; 326/113
(58) Field of Search ....................... 326/28, 83, 95, 326/96, 97, 98; 327/437

(56) References Cited

U.S. PATENT DOCUMENTS

| | | | |
|---|---|---|---|
| 4,247,791 A | 1/1981 | Rovell | 307/238 |
| 5,859,548 A | 1/1999 | Kong | 326/113 |
| 6,211,704 B1 | 4/2001 | Kong | 326/121 |

OTHER PUBLICATIONS

Choe et al., "Dynamic Half Rail Differential Logic for Low Power", IEEE 1997, pp. 1936 to 1939.
Jung et al., "Modular Charge Recycling pass Transistor Logic (MCRPL)", Electronics Letters, Mar. 2, 2000 vol. 36 No. 5, Mar. 2, 2000, pp. 404 to 405.
Kong et al., "Charge Recycling Differential Logic for Low–Power Application", ISSC96 secession 18, IEEE 0–780331962/98, 1998, pp. 302 to 448.
Choe et al., "Half Rail Differential Logic", ISSCC97/Secession 25/Processors and Logic/Paper SP 25.6 IEEE 0–7803–3721–2/97, 1997, pp. 420 to 421, 337 and 489.
Won et al., "Modified Half Rail Differential Logic for Reduced Internal Logic Swing", IEEE 0–7803–4455–3/98, 1998, pp. II–157 to II–160.
Kong et al., "Charge Recycling Differential Logic (CRDL) for Low–Power Application", IEEE Journal of Solid–State Circuits, vol. 31, No. 9, Sep. 1996, pp. 1267–to 1276.

*Primary Examiner*—Daniel Chang
(74) *Attorney, Agent, or Firm*—Gunnison, McKay & Hodgson, L.L.P.; Philip J. McKay

(57) ABSTRACT

In a synchronous clocked full-rail differential logic circuit with single-rail logic and shut-off the complementary logic function of the prior art is replaced by a single transistor appropriately sized to provide the complementary output. Consequently, the synchronous clocked full-rail differential logic circuits with single-rail logic and shut-off of the invention are smaller, less complex and are capable of operating efficiently under heavy load conditions without the increased size and the significant reduction in speed associated with prior art full-rail differential logic circuits. The addition of the shut-off device provides a full-rail differential logic circuit with shut-off that does not experience the "dip" experienced by prior art full-rail differential logic circuits and is therefore more power efficient and is more resistant to noise than prior art full-rail differential logic circuits.

14 Claims, 6 Drawing Sheets

SYNCHRONOUS CLOCKED FULL-RAIL DIFFERENTIAL LOGIC WITH SINGLE-RAIL LOGIC AND SHUT-OFF

FIELD OF THE INVENTION

The present invention relates generally to logic circuits and, more particularly, to full-rail differential logic circuits.

BACKGROUND OF THE INVENTION

One example of a prior art full-rail differential logic circuit is presented and discussed at page 112, and shown in FIG. 3(c), in "HIGH SPEED CMOS DESIGN STYLES" by Bernstein et al. of IBM Microelectronics; Kluwer Academic Publishers, 101 Philip Drive, Assinippi Park, Norwell, Mass., 02061; ISBN 0-7923-8220-X, hereinafter referred to as the Bernstein et al. reference, which is incorporated herein by reference, in its entirety, for all purposes.

FIG. 1A shows a prior art full-rail differential logic circuit 100 similar to that discussed in the Bernstein et al. reference. As seen in FIG. 1A, prior art full-rail differential logic circuit 100 included six transistors: PFET 105, PFET 107, PFET 109, PFET 115, PFET 117 and NFET 121. Prior art full-rail differential logic circuit 100 also included: OUT terminal 111 coupled to a terminal 178 of a base logic portion 123A of a logic block 123 and OUTBAR terminal 113 coupled to a terminal 179 of a complementary logic portion 123B of logic block 123. Prior art full-rail differential logic circuit 100 is activated from a clock signal CLKA. As shown in FIG. 1A, signal CLKA was supplied to: gate 116 of PFET 115; gate 118 of PFET 117; gate 129 of PFET 109; and gate 122 of NFET 121.

Prior art full-rail differential logic circuit 100 worked reasonably well, however, during the evaluation phase, prior art full-rail differential logic circuit 100 drew excess power unnecessarily as the relevant inputs, 151 or 153, to logic network 123 were transitioning low to shut off the path of one of the complementary output terminals, out terminal 111 or outBar terminal 113, to ground. The high output terminal, out terminal 111 or outBar terminal 113, therefore experienced a "dip" during the transition when the inputs 151 or 153 switched from high to low and a short circuit current, or crossbar current, path was established from Vdd 102 to ground. This "dip" was undesirable and resulted in significant power being wasted.

In addition, the structure of prior art full-rail differential logic circuit 100 was particularly susceptible to noise. This problem was extremely undesirable, and damaging, since, typically, multiple prior art full-rail differential logic circuits 100 were cascaded in long chains (not shown) of prior art full-rail differential logic circuits 100. In these chain configurations, the susceptibility of prior art full-rail differential logic circuit 100 to noise meant that each successive stage of the chain contributed additional noise and was even more adversely affected by the noise than the previous stage. Consequently, a few stages into a chain of prior art full-rail differential logic circuits 100, noise became the dominant factor in the chain.

In addition, as noted above, since prior art full-rail differential logic circuit 100 was a dual rail logic circuit, requiring an output OUT 111 and a complementary output OUTBAR 113, in the prior art, logic block 123 had to include both a base logic function, via base logic portion 123A of logic block 123, such as an AND gate, OR gate, XOR gate, etc. and the complementary logic function, via complementary logic portion 123B of logic block 123, such as a NAND gate, NOR gate, XNOR gate, etc.

FIG. 1B shows one particular embodiment of a prior art full-rail differential logic circuit 100A that includes a base logic portion 123A that is an AND gate and a complementary logic portion 123B that is a NAND gate. As shown in FIG. 1B, AND gate 123A includes NFET 161 and NFET 163 connected in series. Input 151 is coupled to the control electrode, or gate, of NFET 161 and input 153 is coupled to the control electrode or gate of NFET 163. As also shown in FIG. 1B, NAND gate 123A includes NFET 171 and NFET 173 connected in parallel. Input 151BAR is coupled to the control electrode, or gate, of NFET 171 and input 153BAR is coupled to the control electrode or gate of NFET 173. Consequently, in the prior art, four transistors were required to provide the output OUT 111 and its complementary output OUTBAR 113.

This need in the prior art to include both a base logic function and its complementary logic function resulted in an increase in power usage, an increase in space used, an increase in design complexity, and an increase in heat production.

What is needed is a method and apparatus for creating full-rail differential logic circuits that are more flexible, more space efficient and more reliable than prior art full-rail differential logic circuits, do not experience the large "dip" experienced by prior art full-rail differential logic circuit 100 and is therefore more power efficient. In addition, it is desirable to have a full-rail differential logic circuit that is more resistant to noise than prior art full-rail differential logic circuit 100.

SUMMARY OF THE INVENTION

According to the synchronous clocked full-rail differential logic circuits with single-rail logic and shut-off of the invention, the complementary logic function of the prior art is replaced by a single transistor appropriately sized to provide the complementary output OUTBAR. Consequently, synchronous clocked full-rail differential logic circuits with single-rail logic and shut-off of the invention use less power and, therefore, generate less heat, require less space, and are simpler in design so that they are more flexible, more space efficient and more reliable than prior art full-rail differential logic circuits.

In addition, according to the present invention, synchronous clocked full-rail differential logic circuits with single-rail logic and shut-off include shut-off devices to minimize the "dip" at the high output node that was associated with prior art clocked full-rail differential logic circuits. The shut-off device of the invention isolates the high output terminal immediately from the input terminals when the complementary output terminal is pulled to ground. Consequently, according to the present invention, the window period, or path, for the short circuit current, or crossbar current, is significantly decreased and power is saved.

In addition, since synchronous clocked full-rail differential logic circuits with single-rail logic and shut-off include a shut-off device, the high output terminal is isolated from the input terminals and the noise immunity of the synchronous clocked full-rail differential logic circuits with single-rail logic and shut-off of the invention is significantly better than prior art clocked full-rail differential logic circuits because noise on the input terminal does not affect the high output terminal after evaluation. Consequently, the synchronous clocked full-rail differential logic circuits with single-rail logic and shut-off of the invention are better suited for application in cascaded chains.

As discussed above, the synchronous clocked full-rail differential logic circuits with single-rail logic and shut-off of the invention can be cascaded together to form the chains commonly used in the industry. When the synchronous clocked full-rail differential logic circuits with single-rail logic and shut-off of the invention are cascaded together, the advantages of the synchronous clocked full-rail differential logic circuits with single-rail logic and shut-off of the invention are particularly evident and the gains in terms of noise immunity, power efficiency, size reduction and flexibility are further pronounced.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 1A:
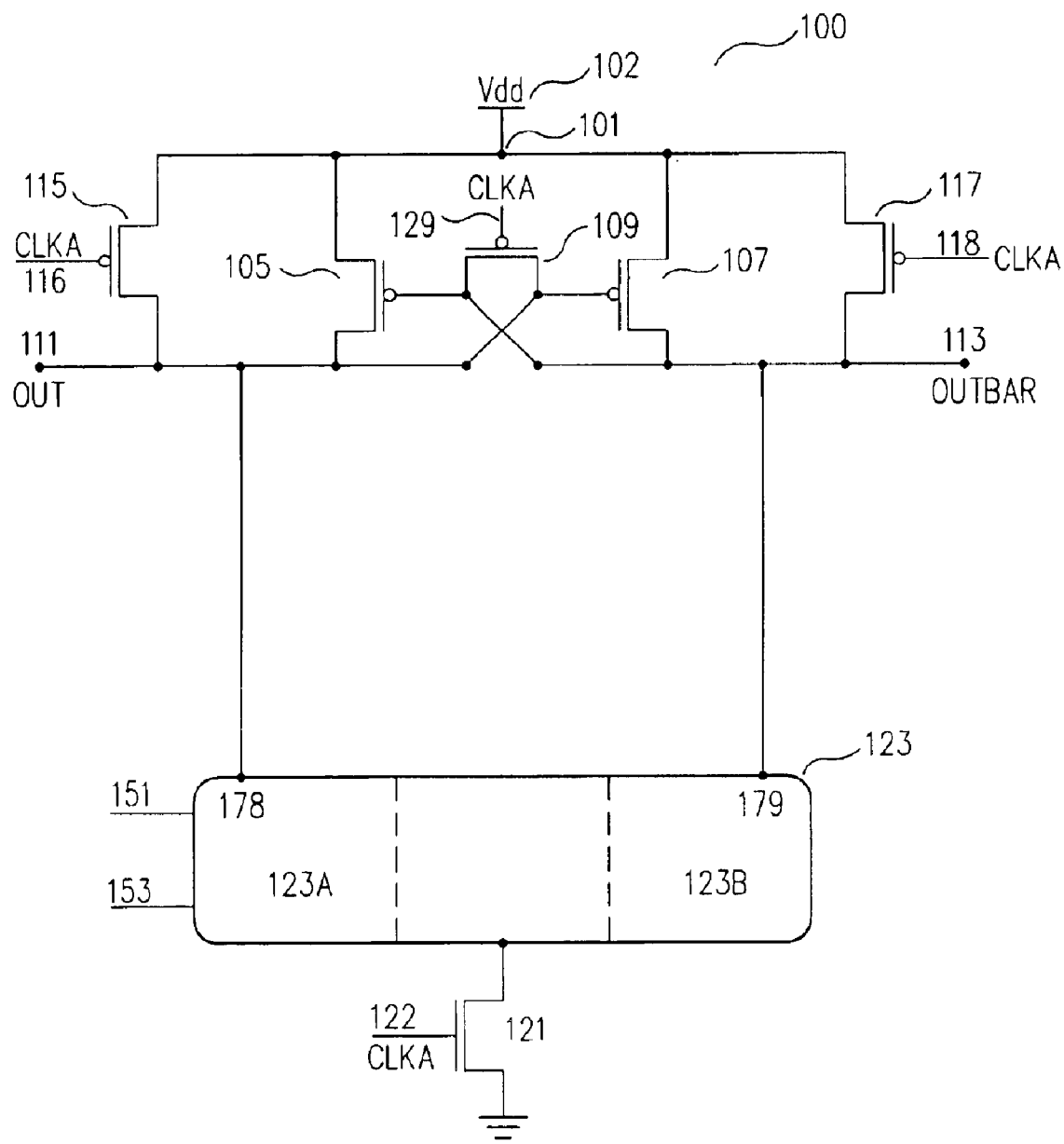
FIG. 1A shows a schematic diagram of a prior art full-rail differential logic circuit.
Figure 1B:
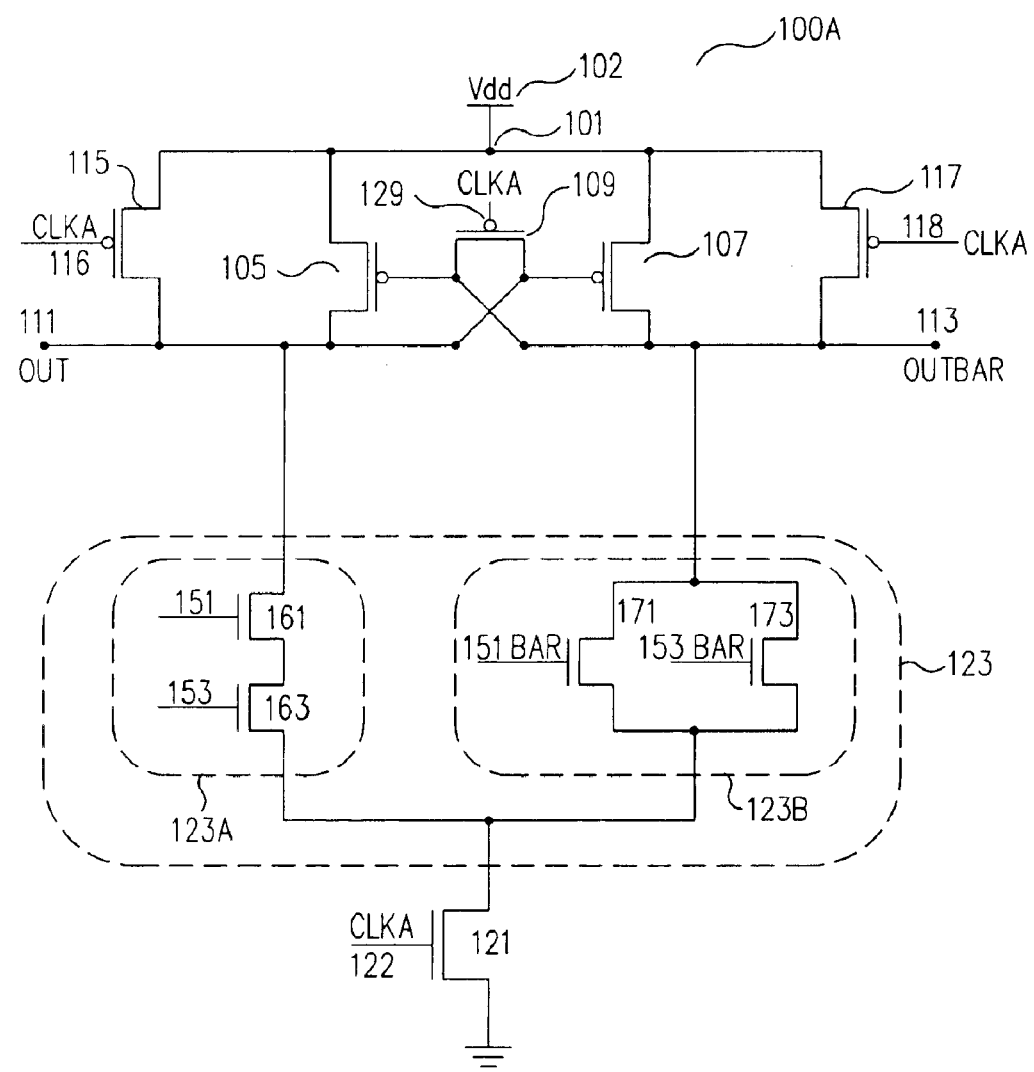
FIG. 1B shows one particular embodiment of a prior art full-rail differential logic circuit that includes a base logic portion that is an AND gate and a complementary logic portion that is a NAND gate.
Figure 3:
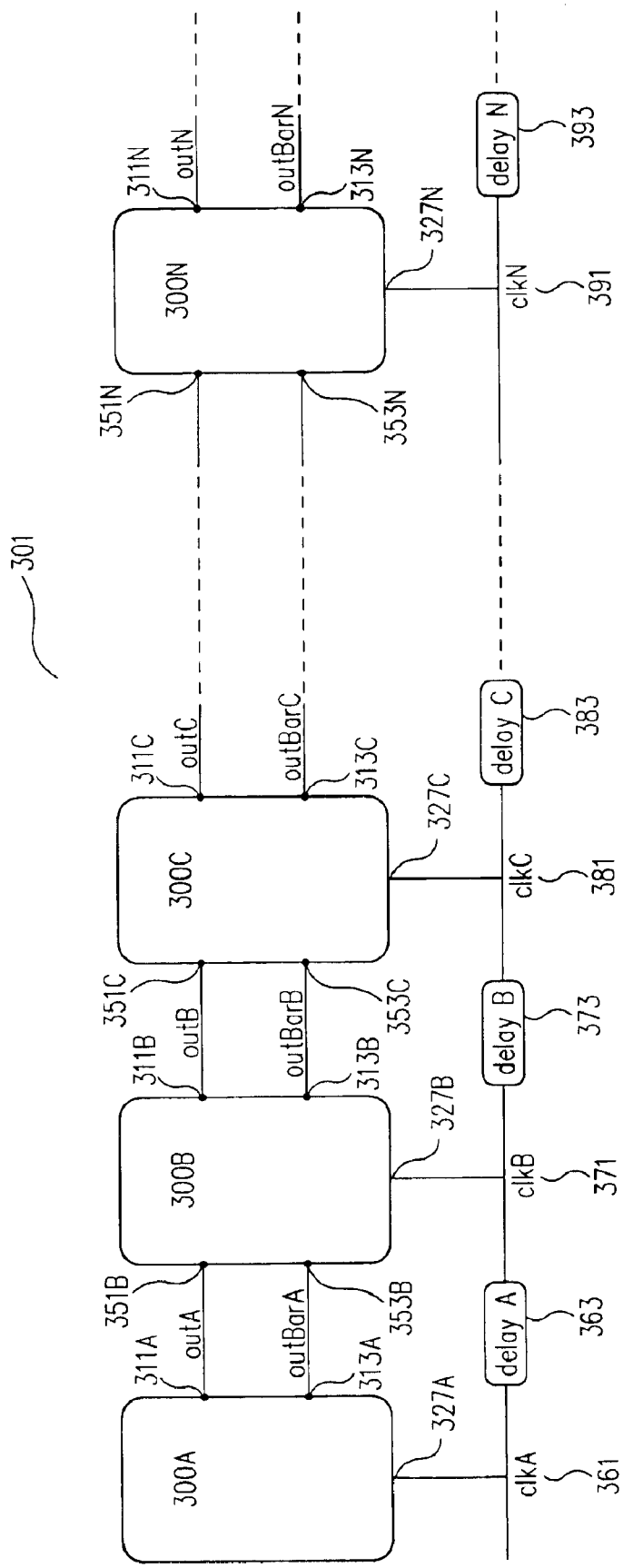
FIG. 3 shows one embodiment of a cascaded chain of synchronous clocked full-rail differential logic circuits with single-rail logic and shut-off according to the principles of the present invention.
Figure 4:
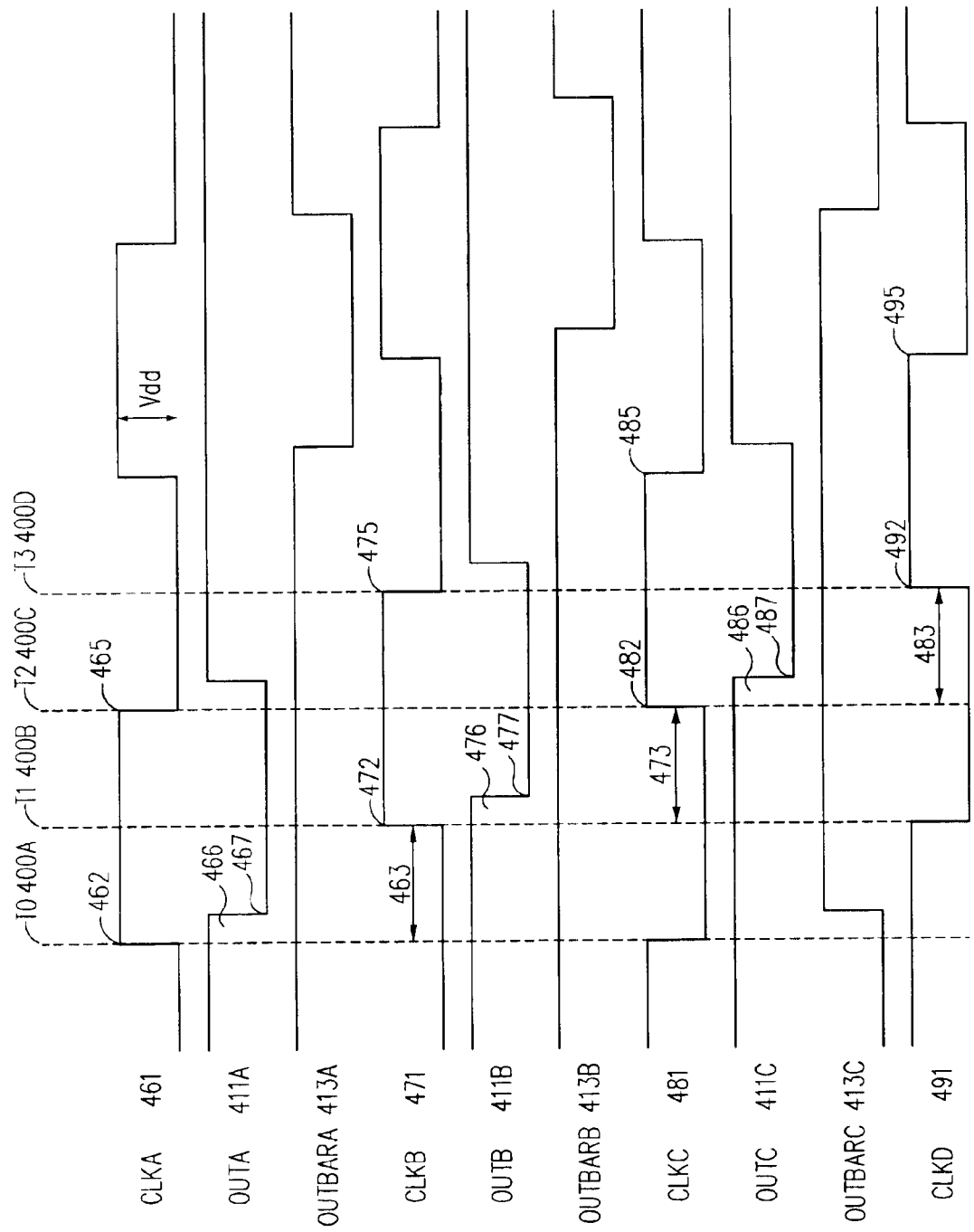
FIG. 4 is a one embodiment of a timing diagram for the cascaded chain of synchronous clocked full-rail differential logic circuits with single-rail logic and shut-off of the invention shown in FIG. 3.

According to the synchronous clocked full-rail differential logic circuits with single-rail logic and shut-off of the invention (200 in FIG. 2A, 200A in FIG. 2B, 300A to 300N in FIG. 3), the complementary logic function of the prior art 123B in FIG. 1A and FIG. 1B) is replaced by a single transistor (291 in FIG. 2A and FIG. 2B) appropriately sized to provide the complementary output OUTBAR (213 in FIG. 2A and FIG. 2B, 413A, 413B, 413C in FIG. 4). Consequently, synchronous clocked full-rail differential logic circuits with single-rail logic and shut-off of the invention use less power and, therefore, generate less heat, require less space, and are simpler in design so that they are more flexible, more space efficient and more reliable than prior art full-rail differential logic circuits.

In addition, according to the present invention, synchronous clocked full-rail differential logic circuits with single-rail logic and shut-off include shut-off devices (280 in FIG. 2A and FIG. 2B) to minimize the "dip" at the high output node that was associated with prior art clocked full-rail differential logic circuits. The shut-off device of the invention isolates the high output terminal immediately from the input terminals when the complementary output terminal is pulled to ground. Consequently, according to the present invention, the window period, or path, for the short circuit current, or crossbar current, is significantly decreased and power is saved.

In addition, since synchronous clocked full-rail differential logic circuits with single-rail logic and shut-off include a shut-off device, the high output terminal is isolated from the input terminals and the noise immunity of the synchronous clocked full-rail differential logic circuits with single-rail logic and shut-off of the invention is significantly better than prior art clocked full-rail differential logic circuits because noise on the input terminal does not affect the high output terminal after evaluation. Consequently, the synchronous clocked full-rail differential logic circuits with single-rail logic and shut-off of the invention are better suited for application in cascaded chains.

As discussed above, the synchronous clocked full-rail differential logic circuits with single-rail logic and shut-off of the invention can be cascaded together to form the chains commonly used in the industry. When the synchronous clocked full-rail differential logic circuits with single-rail logic and shut-off of the invention are cascaded together, the advantages of the synchronous clocked full-rail differential logic circuits with single-rail logic and shut-off of the invention are particularly evident and the gains in terms of noise immunity, power efficiency, size reduction and flexibility are further pronounced.

Figure 2A:
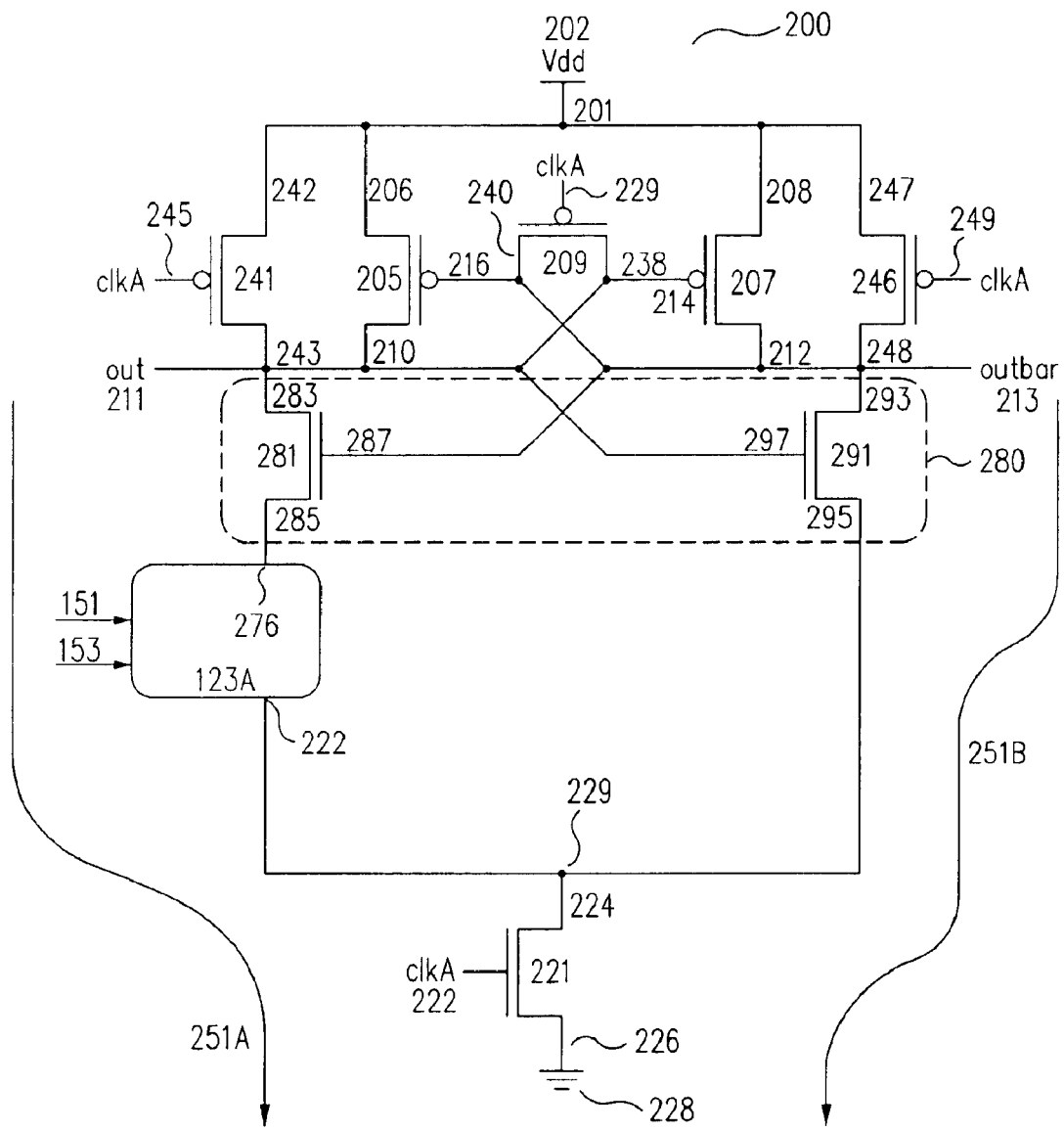
FIG. 2A shows a schematic diagram of one embodiment of a synchronous clocked full-rail differential logic circuit with single-rail logic and shut-off designed according to the principles of the present invention.

FIG. 2A shows a schematic diagram of one embodiment of a synchronous clocked full-rail differential logic circuit with single-rail logic and shut-off 200 designed according to the principles of the present invention. As seen in FIG. 2A, synchronous clocked full-rail differential logic circuit with single-rail logic and shut-off 200 includes a first supply voltage 202 coupled to a first node 201. First node 201 is coupled to: a source 206 of a first transistor, PFET 205; a source 208 of a second transistor, PFET 207; a source 242 of a fourth transistor, PFET 241 and a source 247 of a fifth transistor, PFET 246. The clock signal CLKA is coupled to: a control electrode or gate 245 of PFET 241; a control electrode or gate 249 of PFET 246; a control electrode or gate 229 of a third transistor, PFET 209; and a control electrode or gate 222 of a eighth transistor, NFET 221.

A control electrode or gate 216 of PFET 205 is coupled to a source 240 of PFET 209 and an outBar terminal 213. A control electrode or gate 214 of PFET 207 is coupled to a drain 238 of PFET 209 and an out terminal 211. A drain 210 of PFET 205 is coupled to out terminal 211 and a drain 212 of PFET 207 is coupled to outBar terminal 213.

As discussed above, gate 245 of PFET 241 is coupled to clock signal CLKA, as is gate 249 of PFET 246. A drain 243 of PFET 241 is coupled to out terminal 211 and a drain 248, of PFET 249 is coupled to outBar terminal 213.

According to the invention, synchronous clocked full-rail differential logic circuit with single-rail logic and shut-off 200 also includes shut-off device 280. In one embodiment of the invention, shut-off device 280 includes a sixth transistor, NFET 281, including a drain 283, a source 285 and a control electrode or gate 287. Drain 210 of PFET 205 is coupled to drain 283 of NFET 281. Source 285 of NFET 281 is coupled to a terminal 276 of a base logic network 123A. Gate 287 of NFET 281 is coupled to source 240 of PFET 209 and synchronous clocked full-rail differential logic circuit with single-rail logic and shut-off outBar terminal 213.

In one embodiment of the invention, shut-off device 280 also includes a seventh transistor, NFET 291 including a drain 293, a source 295 and a control electrode or gate 297. As discussed in more detail below, NFET 291 also acts a complementary output transistor. Consequently, NFET 291 is also referred to herein as complementary output transistor 291. Drain 212 of PFET 207 is coupled to drain 293 of complementary output transistor 291. Source 295 of complementary output transistor 291 is coupled to coupled to a second node 229 that is coupled to a drain, or first flow electrode 224, of NFET 221. Gate 297 of complementary output transistor 291 is coupled to drain 238 of PFET 209 and synchronous clocked full-rail differential logic circuit with single-rail logic and shut-off out terminal 211.

As noted above, source 285 of NFET 281 is coupled to a terminal 276 of a base logic network 123A. According to one embodiment of the invention, base logic portion 123A includes any type of differential logic and/or circuitry used in the art including various logic gates, logic devices and circuits such as AND gates, OR gates, XOR gates etc. Base logic portion 123A also includes first and second input terminals 151 and 153 that are typically coupled to an out and outBar terminal of a previous synchronous clocked full-rail differential logic circuit with single-rail logic and shut-off stage (not shown) in FIG. 2A.

Base logic portion 123A also includes fourth terminal 299 coupled to second node 229 and drain 224, of NFET 221. A gate or control electrode 222 of NFET 221 is coupled to the signal CLKA and a source, or second flow electrode 226, of NFET 221 is coupled to a second supply voltage 228.

As noted above, according to the invention, synchronous clocked full-rail differential logic circuit with single-rail logic and shut-off 200 includes a seventh transistor, NFET 291 including a drain 293, a source 295 and a control electrode or gate 297. In one embodiment of the invention, NFET 291 also acts a complementary output transistor. Consequently, NFET 291 is also referred to herein as complementary output transistor 291.

A particular embodiment of a synchronous clocked full-rail differential logic circuit with single-rail logic and shut-off 200 according to the invention is shown in FIG. 2A. Those of skill in the art will recognize that synchronous clocked full-rail differential logic circuit with single-rail logic and shut-off 200 can be easily modified. For example, different transistors, i.e., PFETs 205, 207, 209, 241, and 246 or NFETs 281, 291, and 221 can be used. In particular, the NFETs and PFETS shown in FIG. 2A can be readily exchanged for PFETs and NFETs by reversing the polarities of the supply voltages 202 and 228, or by other well known circuit modifications. Consequently, the synchronous clocked full-rail differential logic circuit with single-rail logic and shut-off 200 that is shown in FIG. 2A is simply one embodiment of the invention used for illustrative purposes only and does not limit the present invention to that one embodiment of the invention.

As shown above, according to the invention, the complementary logic portion 123B in FIGS. 1A and 1B, is eliminated and replaced by complementary output transistor 291 (FIG. 2A). According to the invention, complementary output transistor 291 is sized, i.e., has channel dimensions, e.g., channel width, which are smaller than the effective channel dimensions, e.g., effective channel width, of the transistors making up base logic portion 123A. According to the invention, this is specifically done to insure that discharge path 251A, between out terminal 211 and second supply voltage 228 through base logic portion 123A, is faster than the discharge path 251B, between outBar terminal 213 and second supply voltage 228, through complementary output transistor 291, to insure proper operation of synchronous clocked full-rail differential logic circuit with single-rail logic and shut-off 200.

Figure 2B:
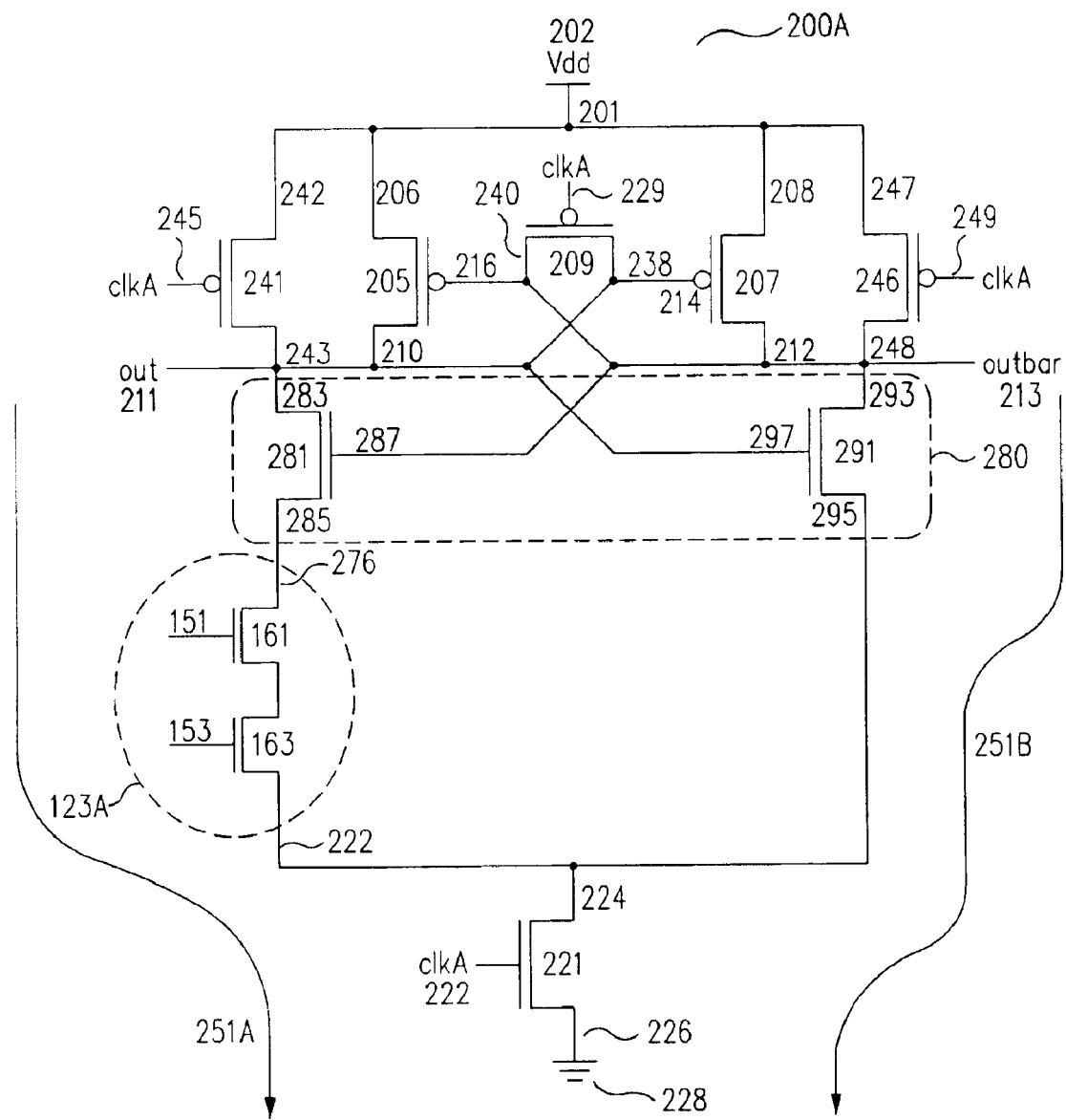
FIG. 2B shows one particular embodiment of a synchronous clocked full-rail differential logic circuit with single-rail logic and shut-off that includes a base logic portion that is an AND gate.

FIG. 2B shows one particular embodiment of a synchronous clocked full-rail differential logic circuit with single-rail logic and shut-off 200A that includes a base logic portion 123A that is an AND gate. As shown in FIG. 2B, AND gate 123A includes NFET 161 and NFET 163 connected in series. Input 151 is coupled to the control electrode, or gate, of NFET 161 and input 153 is coupled to the control electrode or gate of NFET 163. As also shown in FIG. 2B, according to the invention, NAND gate 123B of FIG. LB, including NFET 171 and NFET 173, is replaced by single complementary output transistor 291 (FIG. 2B). Consequently, in this most simple example, using the method and structure of the invention results a significant reduction in components. Of course, those of skill in the art will recognize that when more complicated logic functions make up base logic portion 123A, using the present invention, even more components will be eliminated at an even greater savings in terms of dissipated power and heat, space, and circuit complexity.

As discussed above, synchronous clocked full-rail differential logic circuit with single-rail logic and shut-off 200 can be cascaded together with other synchronous clocked full-rail differential logic circuits with single-rail logic and shut-off 200 to form the chains commonly used in the industry. When synchronous clocked full-rail differential logic circuits with single-rail logic and shut-off 200 of the invention are cascaded together, the advantages of synchronous clocked full-rail differential logic circuit with single-rail logic and shut-off 200 is particularly evident and the gains in terms of efficiency, size reduction and flexibility are further pronounced.

When synchronous clocked full-rail differential logic circuits with single-rail logic and shut-off 200 of the invention are cascaded together, the delayed clock signal CLKA is, according to the invention, timed to be at least the delay of the previous synchronous clocked full-rail differential logic circuit with single-rail logic and shut-off 200 (not shown) to ensure each synchronous clocked full-rail differential logic circuit with single-rail logic and shut-off 200 of the invention is switched or "fired" only after it has received an input from the previous synchronous clocked full-rail differential logic circuit with single-rail logic and shut-off 200.

FIG. 3 shows one embodiment of a cascaded chain 301 of synchronous clocked full-rail differential logic circuits with single-rail logic and shut-off 300A, 300B, and 300C and 300N of the present invention. Each synchronous clocked full-rail differential logic circuit with single-rail logic and shut-off 300A, 300B, 300C and 300N represents a stage in cascaded chain 301. In one embodiment of the invention, each synchronous clocked full-rail differential logic circuit with single-rail logic and shut-off 300A, 300B, 300C and 300N is similar to synchronous clocked full-rail differential logic circuit with single-rail logic and shut-off 200 discussed above with respect to FIG. 2A.

As seen in FIG. 3, synchronous clocked full-rail differential logic circuit with single-rail logic and shut-off 300A includes: a clock input terminal 327A; an out terminal 311A; and an outBar terminal 313A. Synchronous clocked full-rail differential logic circuit with single-rail logic and shut-off 300B includes: a clock input terminal 327B; an input terminal 351B, coupled to out terminal 311A of synchronous clocked full-rail differential logic circuit with single-rail logic and shut-off 300A; an inputBar terminal 353B, coupled to outBar terminal 313A of synchronous clocked full-rail differential logic circuit with single-rail logic and shut-off 300A; an output terminal 311B; and an outBar terminal 313B. Likewise, synchronous clocked full-rail differential logic circuit with single-rail logic and shut-off 300C includes: a clock input terminal 327C; an input terminal 351C, coupled to output terminal 311B of synchronous clocked full-rail differential logic circuit with single-rail logic and shut-off 300B; an inputBar terminal 353C, coupled to outBar terminal 313B of synchronous clocked full-rail differential logic circuit with single-rail logic and shut-off 300B; an output terminal 311C; and an outBar terminal 313C. Synchronous clocked full-rail differential logic circuit with single-rail logic and shut-off 300N includes: a clock input terminal 327N; an input terminal 351N, coupled to an output terminal 311N−1 (not shown) of a synchronous clocked full-rail differential logic circuit with single-rail logic and shut-off 300N−1 (not shown); an inputBar terminal 353N, coupled to an outBar terminal 313N−1 (not shown) of a synchronous clocked full-rail differential logic circuit with single-rail logic and shut-off 300N−1 (not shown); an output terminal 311N; and an outBar terminal 313N.

According to the invention, any number of synchronous clocked full-rail differential logic circuits with single-rail logic and shut-off 300A, 300B, 300C and 300N can be employed with cascaded chain 301. As also shown in FIG. 3, and discussed above, output terminal 311A of synchronous clocked full-rail differential logic circuit with single-rail logic and shut-off 300A couples signal OUTA to input terminal 351B of synchronous clocked full-rail differential logic circuit with single-rail logic and shut-off 300B and outBar terminal 313A of synchronous clocked full-rail differential logic circuit with single-rail logic and shut-off 300A couples signal OUTBARA to inputBar terminal 353B of synchronous clocked full-rail differential logic circuit with single-rail logic and shut-off 300B. Likewise, output terminal 311B of synchronous clocked full-rail differential logic circuit with single-rail logic and shut-off 300B couples signal OUTB to input terminal 351C of synchronous clocked full-rail differential logic circuit with single-rail logic and shut-off 300C and outBar terminal 313B of synchronous clocked full-rail differential logic circuit with single-rail logic and shut-off 300B couples signal OUTBARB to inputBar terminal 353C of synchronous clocked full-rail differential logic circuit with single-rail logic and shut-off 300C. In addition, output terminal 311N of synchronous clocked full-rail differential logic circuit with single-rail logic and shut-off 300N couples signal OUTN to an input terminal 351N+1 (not shown) of a synchronous clocked full-rail differential logic circuit with single-rail logic and shut-off 300N+1 (not shown) and outBar terminal 313N of synchronous clocked full-rail differential logic circuit with single-rail logic and shut-off 300N couples signal OUTBARN to an inputBar terminal 353N+1 (not shown) of a synchronous clocked full-rail differential logic circuit with single-rail logic and shut-off 300N+1 (not shown).

In addition to the structure discussed above, according to the invention, each synchronous clocked full-rail differential logic circuit with single-rail logic and shut-off 300A, 300B, 300C and 300N of cascaded chain 301 receives its own delayed clock signal CLKA 361, CLKB 371, CLKC 381 and CLKN 391, respectively. According to the invention clock signals CLKA 361, CLKB 371, CLKC 381 and CLKN 391 are provided to synchronous clocked full-rail differential logic circuits with single-rail logic and shut-off 300A, 300B, 300C and 300N, respectively, by introducing delay circuits 363, 373, 383 and 393 between successive synchronous clocked full-rail differential logic circuits with single-rail logic and shut-off 300A, 300B, 300C and 300N. Consequently, delay circuit 363 introduces a delay time between signal CLKA 361, coupled to clock input terminal 327A of synchronous clocked full-rail differential logic circuit with single-rail logic and shut-off 300A, and signal CLKB 371, coupled to clock input terminal 327B of synchronous clocked full-rail differential logic circuit with single-rail logic and shut-off 300B. Delay circuit 373 introduces a delay time between signal CLKB 371 and signal CLKC 381, coupled to clock input terminal 327C of synchronous clocked full-rail differential logic circuit with single-rail logic and shut-off 300C. Two delay circuits 363 and 373 introduce two delay times between signal CLKA 361 and signal CLKC 381. Likewise, a series of N−1 delay circuits, and N−1 delay times, exists between signal CLKA 361 and signal CLKN 391, coupled to clock input terminal 327N of synchronous clocked full-rail differential logic circuit with single-rail logic and shut-off 300N, and a further delay circuit 393 introduces a further delay time between CLKN 391 and CLK N+1 (not shown) coupled to a clock input terminal 327N+1 (not shown) of a synchronous clocked full-rail differential logic circuit with single-rail logic and shut-off 300N+1 (not shown).

Delay circuits 363, 373, 383 and 393 are any one of many delay circuits known in the art such as inverters, or groups of inverters, gates, transistors or any other elements that introduce a time delay. According to the invention, delay circuits 363, 373, 383 and 393 are used to ensure the activation of each stage, i.e., each synchronous clocked full-rail differential logic circuit with single-rail logic and shut-off 300A, 300B, 300C and 300N, is timed such that the delay of the clock is longer than the evaluation duration of the previous stage. In one embodiment of the invention, the delayed clock signals CLKA 361, CLKB 371, CLKC 381 and CLKN 391 are timed to switch high (active) when the differential input voltage to synchronous clocked full-rail differential logic circuit with single-rail logic and shut-off 300A, 300B, 300C and 300N reaches a predetermined voltage level. The clock delay can be adjusted according to the predetermined differential voltage level required for robustness and the specific needs of the circuit designer. This differential voltage level is typically a function of process and will vary from circuit to circuit and system to system.

FIG. 4 is one embodiment of a timing diagram for cascaded chain 301 of synchronous clocked full-rail differential logic circuits with single-rail logic and shut-off 300A, 300B, and 300C and 300N of FIG. 3. As seen in FIG. 3 and FIG. 4 together, according to one embodiment of the invention, at time T0, i.e., point 400A in FIG. 4, signal CLKA 461 goes high. After a short switching delay 466, such as the short switching delay inherent in any circuit, signal OUTA 411A at out terminal 311A switches low at point 467 and signal OUTBARA at outBar terminal 313A remains high. A delay time 463 from point T0 400A and to point T1 400B is introduced by delay circuit 363. As discussed above, delay time 463 helps ensure synchronous clocked full-rail differential logic circuit with single-rail logic and shut-off 300B receives signals OUTA and OUTBARA from synchronous clocked full-rail differential logic circuit with single-rail logic and shut-off 300A before the switching of signal CLKB 471.

At point 472 in FIG. 4, i.e., at point T1 400B, signal CLKB 471 switches high. After a short switching delay 476, signal OUTB 411B at out terminal 311B switches low at point 477 and signal OUTBARB at outBar terminal 313B remains high. A delay time 473 from point T1 400B to point T2 400C is introduced by delay circuit 373. As discussed above, delay time 473 helps ensure synchronous clocked full-rail differential logic circuit with single-rail logic and shut-off 300C receives signals OUTB and OUTBARB from synchronous clocked full-rail differential logic circuit with single-rail logic and shut-off 300B before the switching of signal CLKC 481.

At point 482 in FIG. 4, i.e., at point T2 400C, signal CLKC 481 switches high. After a short switching delay 486, signal OUTC 411C at out terminal 311C switches low at point 487 and signal OUTBARC at outBar terminal 313C remains high. A delay time 483 from point T2 400C to point T3 400D is introduced by delay circuit 383. As discussed above, delay time 483 helps ensure the following synchronous clocked full-rail differential logic circuit with single-rail logic and shut-off (not shown) receives signals OUTC and OUTBARC from synchronous clocked full-rail differential logic circuit with single-rail logic and shut-off 300C before the switching of signal CLKD 491.

At point 492 in FIG. 4, i.e., at point T3 400D, signal CLKD 491 switches high.

As discussed above, according to the invention, any number of synchronous clocked full-rail differential logic circuits with single-rail logic and shut-off 300A, 300B, 300C and 300N can be employed with cascaded chain 301. In addition, the process discussed above will repeat for each switching of the system clock. Those of skill in the art will further recognize that the choice of signal highs and signal lows was made arbitrarily in FIG. 4 for illustrative purposes only and that at other times, and in other embodiments of the invention, signal highs could be replaced with signal lows and vice-versa.

As discussed above, the synchronous clocked full-rail differential logic circuits with single-rail logic and shut-off of the invention, the complementary logic function of the prior art is replaced by a single transistor appropriately sized to provide the complementary output OUTBAR. Consequently, synchronous clocked full-rail differential logic circuits with single-rail logic and shut-off of the invention use less power and, therefore, generate less heat, require less space, and are simpler in design so that they are more flexible, more space efficient and more reliable than prior art full-rail differential logic circuits.

In addition, according to the present invention, synchronous clocked full-rail differential logic circuits with single-rail logic and shut-off include shut-off devices to minimize the "dip"[1] at the high output node that was associated with prior art clocked full-rail differential logic circuits. The shut-off device of the invention isolates the high output terminal immediately from the input terminals when the complementary output terminal is pulled to ground. Consequently, according to the present invention, the window period, or path, for the short circuit current, or crossbar current, is significantly decreased and power is saved.

In addition, since synchronous clocked full-rail differential logic circuits with single-rail logic and shut-off include a shut-off device, the high output terminal is isolated from the input terminals and the noise immunity of the synchronous clocked full-rail differential logic circuits with single-rail logic and shut-off of the invention is significantly better than prior art clocked full-rail differential logic circuits because noise on the input terminal does not affect the high output terminal after evaluation. Consequently, the synchronous clocked full-rail differential logic circuits with single-rail logic and shut-off of the invention are better suited for application in cascaded chains.

As also discussed above, the synchronous clocked full-rail differential logic circuits with single-rail logic and shut-off of the invention can be cascaded together to form the chains commonly used in the industry. When the synchronous clocked full-rail differential logic circuits with single-rail logic and shut-off of the invention are cascaded together, the advantages of the synchronous clocked full-rail differential logic circuits with single-rail logic and shut-off of the invention are particularly evident and the gains in terms of efficiency, size reduction and flexibility are further pronounced.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A cascaded chain of synchronous clocked full-rail differential logic circuits with single-rail logic and shut-off comprising:

a first supply voltage;

a second supply voltage;

a first clocked full-rail differential logic circuit with shut-off, said first synchronous clocked full-rail differential logic circuit with single-rail logic and shut-off comprising:

a first synchronous clocked full-rail differential logic circuit with single-rail logic and shut-off out terminal;

a first synchronous clocked full-rail differential logic circuit with single-rail logic and shut-off outBar terminal;

a first synchronous clocked full-rail differential logic circuit with single-rail logic and shut-off first node, said first synchronous clocked full-rail differential logic circuit with single-rail logic and shut-off first node being coupled to said first supply voltage;

a first transistor, said first transistor comprising a first transistor first flow electrode, a first transistor second flow electrode and a first transistor control electrode, said first synchronous clocked full-rail differential logic circuit with single-rail logic and shut-off first node being coupled to said first transistor first flow electrode, said first transistor second flow electrode being coupled to said first synchronous clocked full-rail differential logic circuit with single-rail logic and shut-off out terminal;

a second transistor, said second transistor comprising a second transistor first flow electrode, a second transistor second flow electrode and a second transistor control electrode, said first synchronous clocked full-rail differential logic circuit with single-rail logic and shut-off first node being coupled to said second transistor first flow electrode, said second transistor second flow electrode being coupled to said first synchronous clocked full-rail differential logic circuit with single-rail logic and shut-off outBar terminal;

a third transistor, said third transistor comprising a third transistor first flow electrode, a third transistor second flow electrode and a third transistor control electrode, said first transistor control electrode being coupled to said third transistor first flow electrode and said first synchronous clocked full-rail differential logic circuit with single-rail logic and shut-off outBar terminal, said second transistor control electrode being coupled to said third transistor second flow electrode and said first synchronous clocked full-rail differential logic circuit with single-rail logic and shut-off out terminal;

a fourth transistor, said fourth transistor comprising a fourth transistor first flow electrode, a fourth transistor second flow electrode and a fourth transistor control electrode; said fourth transistor first flow electrode being coupled to said first synchronous clocked full-rail differential logic circuit with single-rail logic and shut-off first node, said fourth transistor second flow electrode being coupled to said first synchronous clocked full-rail differential logic circuit with single-rail logic and shut-off out terminal, said fourth transistor control electrode being coupled to a first clock signal;

a fifth transistor, said fifth transistor comprising a fifth transistor first flow electrode, a fifth transistor second flow electrode and a fifth transistor control electrode; said fifth transistor first flow electrode being coupled to said first synchronous clocked full-rail differential logic circuit with single-rail logic and shut-off first node, said fifth transistor second flow electrode being coupled to said first synchronous clocked full-rail differential logic circuit with single-rail logic and shut-off outBar terminal, said fifth transistor control electrode being coupled to said first clock signal;

a first synchronous clocked full-rail differential logic circuit with single-rail logic and shut-off shut-off device coupled between said first synchronous clocked full-rail differential logic circuit with single-rail logic and shut-off out terminal and said first synchronous clocked full-rail differential logic circuit with single-rail logic and shut-off outBar terminal;

a base logic portion, said base logic portion comprising a base logic portion first input terminal, a base logic portion second input terminal, a base logic portion out terminal, and a base logic portion fourth terminal, said base logic portion out terminal being coupled to said first synchronous clocked full-rail differential logic circuit with single-rail logic and shut-off out terminal;

a first synchronous clocked full-rail differential logic circuit with single-rail logic and shut-off complementary output transistor, said first synchronous clocked full-rail differential logic circuit with single-rail logic and shut-off complementary output transistor comprising a first synchronous clocked full-rail differential logic circuit with single-rail logic and shut-off complementary output transistor first flow electrode, a first synchronous clocked full-rail differential logic circuit with single-rail logic and shut-off complementary output transistor second flow electrode and a first synchronous clocked full-rail differential logic circuit with single-rail logic and shut-off complementary output transistor first flow electrode being coupled to said third transistor first flow electrode and said first synchronous clocked full-rail differential logic circuit with single-rail logic and shut-off outBar terminal, said first synchronous clocked full-rail differential logic circuit with single-rail logic and shut-off complementary output transistor second flow electrode being coupled to a first synchronous clocked full-rail differential logic circuit with single-rail logic and shut-off second node, said first synchronous clocked full-rail differential logic circuit with single-rail logic and shut-off complementary output transistor control electrode being coupled to said third transistor second flow electrode and said first synchronous clocked full-rail differential logic circuit with single-rail logic and shut-off out terminal;

a second clocked full-rail differential logic circuit with shut-off, said second synchronous clocked full-rail differential logic circuit with single-rail logic and shut-off comprising:

a second synchronous clocked full-rail differential logic circuit with single-rail logic and shut-off out terminal;
  a second synchronous clocked full-rail differential logic circuit with single-rail logic and shut-off outBar terminal;
  a second synchronous clocked full-rail differential logic circuit with single-rail logic and shut-off first node, said second synchronous clocked full-rail differential logic circuit with single-rail logic and shut-off first node being coupled to said first supply voltage;

a first transistor, said first transistor comprising a first transistor first flow electrode, a first transistor second flow electrode and a first transistor control electrode, said second synchronous clocked full-rail differential logic circuit with single-rail logic and shut-off first node being coupled to said first transistor first flow electrode, said first transistor second flow electrode being coupled to said second synchronous clocked full-rail differential logic circuit with single-rail logic and shut-off out terminal;

a second transistor, said second transistor comprising a second transistor first flow electrode, a second transistor second flow electrode and a second transistor control electrode, said second synchronous clocked full-rail differential logic circuit with single-rail logic and shut-off first node being coupled to said second transistor first flow electrode, said second transistor second flow electrode being coupled to said second synchronous clocked full-rail differential logic circuit with single-rail logic and shut-off outBar terminal;

a third transistor, said third transistor comprising a third transistor first flow electrode, a third transistor second flow electrode and a third transistor control electrode, said first transistor control electrode being coupled to said third transistor first flow electrode and said second synchronous clocked full-rail differential logic circuit with single-rail logic and shut-off outBar terminal, said second transistor control electrode being coupled to said third transistor second flow electrode and said second synchronous clocked full-rail differential logic circuit with single-rail logic and shut-off out terminal;

a fourth transistor, said fourth transistor comprising a fourth transistor first flow electrode, a fourth transistor second flow electrode and a fourth transistor control electrode; said fourth transistor first flow electrode being coupled to said second synchronous clocked full-rail differential logic circuit with single-rail logic and shut-off first node, said fourth transistor second flow electrode being coupled to said second synchronous clocked full-rail differential logic circuit with single-rail logic and shut-off out terminal, said fourth transistor control electrode being coupled to a second clock signal;

a fifth transistor, said fifth transistor comprising a fifth transistor first flow electrode, a fifth transistor second flow electrode and a fifth transistor control electrode; said fifth transistor first flow electrode being coupled to said second synchronous clocked full-rail differential logic circuit with single-rail logic and shut-off first node, said fifth transistor second flow electrode being coupled to said second synchronous clocked full-rail differential logic circuit with single-rail logic and shut-off outBar terminal, said fifth transistor control electrode being coupled to said second clock signal;

a second synchronous clocked full-rail differential logic circuit with single-rail logic and shut-off shut-off device coupled between said second synchronous clocked full-rail differential logic circuit with single-rail logic and shut-off out terminal and said second synchronous clocked full-rail differential logic circuit with single-rail logic and shut-off outBar terminal;

a base logic portion, said base logic portion comprising a base logic portion first input terminal, a base logic portion second input terminal, a base logic portion out terminal, and a base logic portion fourth terminal, said base logic portion out terminal being coupled to said second synchronous clocked full-rail differential logic circuit with single-rail logic and shut-off out terminal;

a second synchronous clocked full-rail differential logic circuit with single-rail logic and shut-off complementary output transistor, said second synchronous clocked full-rail differential logic circuit with single-rail logic and shut-off complementary output transistor comprising a second synchronous clocked full-rail differential logic circuit with single-rail logic and shut-off complementary output transistor first flow electrode, a second synchronous clocked full-rail differential logic circuit with single-rail logic and shut-off complementary output transistor second flow electrode and a second synchronous clocked full-rail differential logic circuit with single-rail logic and shut-off complementary output transistor control electrode, said second synchronous clocked full-rail differential logic circuit with single-rail logic and shut-off complementary output transistor first flow electrode being coupled to said third transistor first flow electrode and said second clocked full-rail differential logic circuit with single-rail logic and shut-off outBar terminal, said second synchronous clocked full-rail differential logic circuit with single-rail logic and shut-off complementary output transistor second flow electrode being coupled to a second synchronous clocked full-rail differential logic circuit with single-rail logic and shut-off second node, said second synchronous clocked full-rail differential logic circuit with single-rail logic and shut-off complementary output transistor control electrode being coupled to said third transistor second flow electrode and said second synchronous clocked full-rail differential logic circuit with single-rail logic and shut-off out terminal, wherein;

said second clock signal is delayed with respect to said first clock signal by a predetermined delay time.

2. The cascaded chain of synchronous clocked full-rail differential logic circuits with single-rail logic and shut-off of claim 1, wherein;

said first synchronous clocked full-rail differential logic circuit with single-rail logic and shut-off shut-off device comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to said out terminal of said logic network, said sixth transistor control electrode being coupled to said third transistor first flow electrode and said first synchronous clocked full-rail differential logic circuit, with single-rail logic and shut-off outBar terminal;

said first synchronous clocked full-rail differential logic circuit with single-rail logic and shut-off complementary output transistor, further wherein;

said second synchronous clocked full-rail differential logic circuit with single-rail logic and shut-off shut-off device comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to said out terminal of said logic network, said sixth transistor control electrode being coupled to said third transistor first flow electrode and said second synchronous clocked full-rail differential logic circuit with single-rail logic and shut-off outBar terminal;

said second synchronous clocked full-rail differential logic circuit with single-rail logic and shut-off complementary output transistor.

3. The cascaded chain of synchronous clocked full-rail differential logic circuits with single-rail logic and shut-off of claim 2, wherein;

said base logic portion of said first synchronous clocked full-rail differential logic circuit with single-rail logic and shut-off and said base logic portion of said second synchronous clocked full-rail differential logic circuit with single-rail logic and shut-off comprise logic gates.

4. The cascaded chain of synchronous clocked full-rail differential logic circuits with single-rail logic and shut-off of claim 2, wherein;

said base logic portion of said first synchronous clocked full-rail differential logic circuit with single-rail logic and shut-off and said base logic portion of said second synchronous clocked full-rail differential logic circuit with single-rail logic and shut-off comprise NMOS pass transistor logic;

said base logic portion of said first synchronous clocked full-rail differential logic circuit with single-rail logic and shut-off comprises at least one control variable input and at least one pass variable input; and said base logic portion of said second synchronous clocked full-rail differential logic circuit with single-rail logic and shut-off comprises at least one control variable input and at least one pass variable input.

5. The cascaded chain of synchronous clocked full-rail differential logic circuits with single-rail logic and shut-off of claim 2, wherein;

said first supply voltage is Vdd and said second supply voltage is ground.

6. The cascaded chain of synchronous clocked full-rail differential logic circuits with single-rail logic and shut-off of claim 5, wherein;

said first transistor, said second transistor, said third transistor, said fourth transistor and said fifth transistor of said first synchronous clocked full-rail differential logic circuit with single-rail logic and shut-off and said first transistor, said second transistor, said third transistor, said fourth transistor and said fifth transistor of said second synchronous clocked full-rail differential logic circuit with single-rail logic and shut-off are PFETs.

7. The cascaded chain of synchronous clocked full-rail differential logic circuits with single-rail logic and shut-off of claim 6, wherein;

said sixth transistor and a seventh transistor of said first synchronous clocked full-rail differential logic circuit with single-rail logic and shut-off and said sixth transistor and a seventh transistor of said second synchronous clocked full-rail differential logic circuit with single-rail logic and shut-off are NFETs.

8. A synchronous clocked full-rail differential logic circuit with single-rail logic and shut-off comprising:

a first supply voltage;

a second supply voltage;

a clocked full-rail differential logic circuit with single-rail logic and shut-off out terminal;
a clocked full-rail differential logic circuit with single-rail logic and shut-off outBar terminal;
a clocked full-rail differential logic circuit with single-rail logic and shut-off first node, said clocked full-rail differential logic circuit with single-rail logic and shut-off first node being coupled to said first supply voltage;
a first transistor, said first transistor comprising a first transistor first flow electrode, a first transistor second flow electrode and a first transistor control electrode, said clocked full-rail differential logic circuit with single-rail logic and shut-off first node being coupled to said first transistor first flow electrode, said first transistor second flow electrode being coupled to said clocked full-rail differential logic circuit with single-rail logic and shut-off out terminal;
a second transistor, said second transistor comprising a second transistor first flow electrode, a second transistor second flow electrode and a second transistor control electrode, said clocked full-rail differential logic circuit with single-rail logic and shut-off first node being coupled to said second transistor first flow electrode, said second transistor second flow electrode being coupled to said clocked full-rail differential logic circuit with single-rail logic and shut-off outBar terminal;
a third transistor, said third transistor comprising a third transistor first flow electrode, a third transistor second flow electrode and a third transistor control electrode, said first transistor control electrode being coupled to said third transistor first flow electrode and said clocked full-rail differential logic circuit with single-rail logic and shut-off outBar terminal, said second transistor control electrode being coupled to said third transistor second flow electrode and said clocked full-rail differential logic circuit with single-rail logic and shut-off out terminal;
a fourth transistor, said fourth transistor comprising a fourth transistor first flow electrode, a fourth transistor second flow electrode and a fourth transistor control electrode; said fourth transistor first flow electrode being coupled to said clocked full-rail differential logic circuit with single-rail logic and shut-off first node, said fourth transistor second flow electrode being coupled to said clocked full-rail differential logic circuit with single-rail logic and shut-off out terminal, said fourth transistor control electrode being coupled to a clock signal;
a fifth transistor, said fifth transistor comprising a fifth transistor first flow electrode, a fifth transistor second flow electrode and a fifth transistor control electrode; said fifth transistor first flow electrode being coupled to said clocked full-rail differential logic circuit with single-rail logic and shut-off first node, said fifth transistor second flow electrode being coupled to said clocked full-rail differential logic circuit with single-rail logic and shut-off outBar terminal, said fifth transistor control electrode being coupled to said clock signal;
a clocked full-rail differential logic circuit with single-rail logic and shut-off shut-off device coupled between said clocked full-rail differential logic circuit with single-rail logic and shut-off out terminal and said clocked full-rail differential logic circuit with single-rail logic and shut-off outBar terminal;
a base logic portion, said base logic portion comprising a base logic portion first input terminal, a base logic portion second input terminal, a base logic portion out terminal, and a base logic portion fourth terminal, said base logic portion out terminal being coupled to said clocked full-rail differential logic circuit with single-rail logic and shut-off out terminal;
a clocked full-rail differential logic circuit with single-rail logic and shut-off complementary output transistor, said clocked full-rail differential logic circuit with single-rail logic and shut-off complementary output transistor comprising a clocked full-rail differential logic circuit with single-rail logic and shut-off complementary output transistor first flow electrode, a clocked full-rail differential logic circuit with single-rail logic and shut-off complementary output transistor second flow electrode and a clocked full-rail differential logic circuit with single-rail logic and shut-off complementary output transistor control electrode, said clocked full-rail differential logic circuit with single-rail logic and shut-off complementary output transistor first flow electrode being coupled to said third transistor first flow electrode and said clocked full-rail differential logic circuit with single-rail logic and shut-off outBar terminal, said clocked full-rail differential logic circuit with single-rail logic and shut-off complementary output transistor second flow electrode being coupled to a clocked full-rail differential logic circuit with single-rail logic and shut-off second node, said clocked full-rail differential logic circuit with single-rail logic and shut-off complementary output transistor control electrode being coupled to said third transistor second flow electrode and said clocked full-rail differential logic circuit with single-rail logic and shut-off out terminal.

9. The synchronous clocked full-rail differential logic circuit with single-rail logic and shut-off of claim 8, wherein;

said synchronous clocked full-rail differential logic circuit with single-rail logic and shut-off shut-off device comprises:

a sixth transistor, said sixth transistor comprising a sixth transistor first flow electrode, a sixth transistor second flow electrode and a sixth transistor control electrode, said first transistor second flow electrode being coupled to said sixth transistor first flow electrode, said sixth transistor second flow electrode being coupled to said out terminal of said logic network, said sixth transistor control electrode being coupled to said third transistor first flow electrode and said synchronous clocked full-rail differential logic circuit with single-rail logic and shut-off outBar terminal; and said synchronous clocked full-rail differential logic circuit with single-rail logic and shut-off complementary output transistor.

10. The synchronous clocked full-rail differential logic circuit with single-rail logic and shut-off of claim 9, wherein;

said base logic portion of said synchronous clocked full-rail differential logic circuit with single-rail logic and shut-off comprises logic gates.

11. The synchronous clocked full-rail differential logic circuit with single-rail logic and shut-off of claim 9, wherein;

said base logic portion of said synchronous clocked full-rail differential logic circuit with single-rail logic and shut-off comprises NMOS pass transistor logic; and said base logic portion of said synchronous clocked full-rail differential logic circuit with single-rail logic and shut-off comprises at least one control variable input and at least one pass variable input.

12. The synchronous clocked full-rail differential logic circuit with single-rail logic and shut-off of claim 9, wherein;

said first supply voltage is Vdd and said second supply voltage is ground.

13. The synchronous clocked full-rail differential logic circuit with single-rail logic and shut-off of claim 12, wherein;

said first transistor, said second transistor, said third transistor, said fourth transistor and said fifth transistor of said synchronous clocked full-rail differential logic circuit with single-rail logic and shut-off are PFETs.

14. The synchronous clocked full-rail differential logic circuit with single-rail logic and shut-off of claim 13, wherein;

said sixth transistor and said a seventh transistor of said synchronous clocked full-rail differential logic circuit with single-rail logic and shut-off are NFETs.

* * * * *